(12) United States Patent
Hashimoto et al.

(10) Patent No.: US 8,391,007 B2
(45) Date of Patent: Mar. 5, 2013

(54) HEAT SPREADER, ELECTRONIC APPARATUS, AND HEAT SPREADER MANUFACTURING METHOD

(75) Inventors: Mitsuo Hashimoto, Kanagawa (JP); Kazuaki Yazawa, Tokyo (JP); Yuichi Ishida, Kanagawa (JP); Hiroyuki Ryoson, Kanagawa (JP)

(73) Assignee: Sony Corporation, Tokyo (JP)

( * ) Notice: Subject to any disclaimer, the term of this patent is extended or adjusted under 35 U.S.C. 154(b) by 327 days.

(21) Appl. No.: 12/536,996

(22) Filed: Aug. 6, 2009

(65) Prior Publication Data
US 2010/0033933 A1    Feb. 11, 2010

(30) Foreign Application Priority Data
Aug. 11, 2008 (JP) ................ P2008-206562

(51) Int. Cl.
*H05K 7/20* (2006.01)
*F28D 15/02* (2006.01)

(52) U.S. Cl. ... 361/700; 361/698; 361/699; 361/679.52; 165/104.21

(58) Field of Classification Search .................. 361/700, 361/698, 699, 679.52; 165/104.21; 29/890.93, 29/890.035
See application file for complete search history.

(56) References Cited

U.S. PATENT DOCUMENTS

| | | | | |
|---|---|---|---|---|
| 5,694,295 A * | 12/1997 | Mochizuki et al. | ............ | 361/699 |
| 6,082,443 A * | 7/2000 | Yamamoto et al. | ...... | 165/104.26 |
| 6,269,866 B1 * | 8/2001 | Yamamoto et al. | ...... | 165/104.26 |
| 6,407,922 B1 * | 6/2002 | Eckblad et al. | ............... | 361/704 |
| 6,947,285 B2 * | 9/2005 | Chen et al. | ..................... | 361/708 |
| 7,200,006 B2 * | 4/2007 | Farrow et al. | ................. | 361/704 |
| 7,213,637 B2 * | 5/2007 | Lin et al. | .................. | 165/104.26 |
| 7,440,280 B2 * | 10/2008 | Shuy | .............................. | 361/701 |
| 7,679,916 B2 * | 3/2010 | Orr et al. | ....................... | 361/719 |
| 2002/0050341 A1 * | 5/2002 | Dussinger et al. | ........ | 165/104.26 |
| 2002/0135980 A1 * | 9/2002 | Vafai | .............................. | 361/700 |
| 2003/0024691 A1 * | 2/2003 | Tsay et al. | ................ | 165/104.26 |

(Continued)

FOREIGN PATENT DOCUMENTS

| | | |
|---|---|---|
| JP | 2005-322771 | 11/2005 |
| JP | 2006-328260 | 12/2006 |

(Continued)

OTHER PUBLICATIONS

Ayyub et al. Hydrophobic nanowires: Raindrops keep falling off my head NPG Asia Materials ISSN 1884-4057, Jul. 14, 2008.

(Continued)

*Primary Examiner* — Anatoly Vortman
(74) *Attorney, Agent, or Firm* — K&L Gates LLP

(57) ABSTRACT

According to an embodiment, there is provided a heat spreader including an evaporation portion, a first condenser portion, a working fluid, and a first flow path. The evaporation portion is arranged in a first position. The first condenser portion is arranged in a second position, the second position being arranged apart from and higher than the first position. The working fluid evaporates from a liquid phase to a gas phase in the evaporation portion, and condenses from the gas phase to the liquid phase in the first condenser portion. The first flow path is made of a nanomaterial, has hydrophobicity on a surface, and causes the working fluid condensed to the liquid phase in the first condenser portion to flow to the evaporation portion by a gravitational force.

4 Claims, 14 Drawing Sheets

U.S. PATENT DOCUMENTS

| | | | |
|---|---|---|---|
| 2005/0126766 A1* | 6/2005 | Lee et al. | 165/133 |
| 2006/0262571 A1* | 11/2006 | Chen | 362/632 |
| 2006/0291168 A1* | 12/2006 | Lee | 361/701 |
| 2007/0053168 A1* | 3/2007 | Sayir et al. | 361/718 |
| 2007/0058052 A1* | 3/2007 | Makela et al. | 348/231.99 |
| 2007/0089864 A1* | 4/2007 | Chang et al. | 165/104.26 |
| 2007/0126116 A1* | 6/2007 | Dangelo et al. | 257/720 |
| 2007/0158052 A1 | 7/2007 | Lin | |
| 2007/0284089 A1* | 12/2007 | Vadakkanmaruveedu et al. | 165/104.26 |
| 2008/0078531 A1* | 4/2008 | Chung et al. | 165/104.33 |
| 2008/0137307 A1* | 6/2008 | Orr et al. | 361/719 |
| 2008/0174963 A1 | 7/2008 | Chang et al. | |
| 2008/0225489 A1* | 9/2008 | Cai et al. | 361/704 |
| 2008/0245511 A1* | 10/2008 | Lai | 165/104.26 |
| 2009/0056917 A1* | 3/2009 | Majumdar et al. | 165/104.26 |
| 2009/0059535 A1* | 3/2009 | Kim et al. | 361/710 |
| 2009/0166014 A1* | 7/2009 | Chang et al. | 165/133 |
| 2010/0212870 A1* | 8/2010 | Wu et al. | 165/104.26 |
| 2011/0024085 A1* | 2/2011 | Huang et al. | 165/104.26 |
| 2011/0048676 A1* | 3/2011 | Toyoda et al. | 165/104.21 |
| 2011/0100608 A1* | 5/2011 | Huang et al. | 165/104.26 |
| 2011/0103020 A1* | 5/2011 | Dangelo et al. | 361/709 |
| 2011/0127013 A1* | 6/2011 | Kawamura et al. | 165/104.26 |

FOREIGN PATENT DOCUMENTS

| | | |
|---|---|---|
| JP | 2007-147194 | 6/2007 |
| WO | 2007019558 | 2/2007 |

OTHER PUBLICATIONS

Japanese Office Action for corresponding JP2008-206562 issued on May 25, 2010.

Japanese Office Action issued Jul. 5, 2011, for corresponding Japanese Appln. No. 2008-206562.

\* cited by examiner

HEAT SPREADER, ELECTRONIC APPARATUS, AND HEAT SPREADER MANUFACTURING METHOD

CROSS REFERENCES TO RELATED APPLICATIONS

The present application claims priority to Japanese Priority Patent Application JP 2008-206562 filed in the Japan Patent Office on Aug. 11, 2008, the entire content of which is hereby incorporated by reference.

BACKGROUND

The present application relates to a heat spreader thermally connected to a heat source of an electronic apparatus, an electronic apparatus including the heat spreader, and a heat spreader manufacturing method.

In the past, a heat spreader has been used as a device thermally connected to a heat source of an electronic apparatus, such as a CPU (Central Processing Unit) of a PC (Personal Computer), to absorb and diffuse heat of the heat source. As the heat spreader, a solid-type metal heat spreader made of for example a copper plate is known, and a phase-transition-type heat spreader including an evaporation portion and a working fluid has been proposed recently.

In the phase-transition-type heat spreader, the working fluid evaporates in the evaporation portion that receives heat from a heat source, and the evaporated working fluid condenses and flows in a flow path to return to the evaporation portion. By repeating the above operation, the heat of the heat source is diffused (see, for example, United States Patent Application Publication No. 2007/0153052; paragraph 0032, FIG. 4, hereinafter referred to as Patent Document 1). In a heat spreader of Patent Document 1, a wick is provided to a flow path, and a working fluid condensed on an upper surface flows to a lower surface (evaporation portion) with a capillary force.

SUMMARY

An electronic apparatus mounted with such a heat spreader is required to improve a heat density and required to be downsized. Generally, in view of a higher heat density, a wick surface provided to a flow path from a condenser portion to an evaporation portion is subjected to a hydrophilic processing to improve a capillary force, which may, however, result in a biased distribution of the working fluid. Further, in view of downsizing, the flow path is required to be narrower, which may, however, result in an increased flow path resistance. Accordingly, the supply amount of the working fluid to the evaporation portion is decreased, resulting in dryout.

In view of the above-mentioned circumstances, it is desirable to provide a heat spreader capable of improving flow efficiency of a working fluid from a condenser portion to an evaporation portion, and an electronic apparatus including the heat spreader.

It is further desirable to provide a heat spreader manufacturing method that enables easier manufacture and higher reliability.

According to an embodiment, there is provided a heat spreader including an evaporation portion, a first condenser portion, a working fluid, and a first flow path. The evaporation portion is arranged in a first position. The first condenser portion is arranged in a second position, the second position being one of higher than and apart from the first position. The working fluid evaporates from a liquid phase to a gas phase in the evaporation portion, and condenses from the gas phase to the liquid phase in the first condenser portion. The first flow path is made of a nanomaterial, has hydrophobicity on a surface, and causes the working fluid condensed to the liquid phase in the first condenser portion to flow to the evaporation portion.

According to an embodiment, a heat source is thermally connected to the evaporation portion, and a liquid-phase working fluid evaporates to a gas phase in the evaporation portion. The gas-phase working fluid condenses to the liquid phase in the first condenser portion arranged in the higher position than the evaporation portion. The liquid-phase working fluid flows in the first flow path to return to the evaporation portion. The above phase transition is repeated.

The first flow path causes the working fluid to flow from the first condenser portion to the evaporation portion arranged lower than the first condenser portion. Here, since the first flow path has hydrophobicity on the surface, a flow path resistance can be kept lower. In addition, since the first flow path is made of the nanomaterial enabling a higher hydrophobicity, the flow path resistance can be kept further lower. Accordingly, flow efficiency of the working fluid from the first condenser portion to the evaporation portion can be improved.

The heat spreader of this embodiment may further include a second condenser portion and a second flow path. The second condenser portion is arranged in a third position, the third position being one of lower than and apart from the first position, and enables the working fluid to condense from the gas phase to the liquid phase. The second flow path is made of a nanomaterial, has hydrophilicity on a surface, and causes the working fluid condensed to the liquid phase in the second condenser portion to flow to the evaporation portion.

According to an embodiment, in addition to the circulation in the evaporation portion, the first condenser portion, and the first flow path as described above, the working fluid circulates as follows. That is, the working fluid evaporated to the gas phase in the evaporation portion condenses to the liquid phase in the second condenser portion arranged lower than the evaporation portion. The liquid-phase working fluid flows in the second flow path to return to the evaporation portion. The above phase transition is repeated.

The second flow path causes the working fluid to flow from the second condenser portion to the evaporation portion arranged higher than the second condenser portion. The second flow path is made of the nanomaterial enabling a higher hydrophilicity. Here, since the second flow path has hydrophilicity on the surface, the working fluid permeates the second flow path. An extremely minute surface structure of a nanomaterial promotes the flow of the permeated working fluid. By providing both the second flow path and the first flow path, the working fluid is separated and the flow efficiency to the evaporation portion can be improved.

In the heat spreader according to an embodiment, the first flow path may be arranged vertically or inclinatorily.

According to an embodiment, in a case of arranging the first flow path vertically, the flow of the working fluid from the first condenser portion to the evaporation portion can be more efficiently performed. In a case of arranging the first flow path inclinatorily, it is possible to provide a plurality of first flow paths and a plurality of first condenser portions corresponding thereto. Thus, the flow efficiency of the working fluid from the first condenser portions to the evaporation portions can be improved.

In the heat spreader according to an embodiment, the first flow path may include a hydrophilic portion in a direction toward the evaporation portion.

According to an embodiment, the first flow path having hydrophobicity on the surface includes a hydrophilic portion. The first flow path causes the working fluid to flow from the first condenser portion to the evaporation portion with the hydrophobicity thereof and the hydrophilicity of the hydrophilic portion.

According to an embodiment, there is provided an electronic apparatus including a heat source and a heat spreader. The heat spreader is thermally connected to the heat source. The heat spreader includes an evaporation portion, a first condenser portion, a working fluid, and a first flow path. The evaporation portion is arranged in a first position. The first condenser portion is arranged in a second position, the second position being one of higher than and apart from the first position. The working fluid evaporates from a liquid phase to a gas phase in the evaporation portion, and condenses from the gas phase to the liquid phase in the first condenser portion. The first flow path is made of a nanomaterial, has hydrophobicity on a surface, and causes the working fluid condensed to the liquid phase in the first condenser portion to flow to the evaporation portion.

In the heat spreader according to an embodiment, a liquid-phase working fluid evaporates to a gas phase in the evaporation portion. The gas-phase working fluid condenses to the liquid phase in the first condenser portion arranged in the higher position than the evaporation portion. The liquid-phase working fluid flows in the first flow path to return to the evaporation portion. The above phase transition is repeated.

The first flow path of the heat spreader causes the working fluid to flow from the first condenser portion to the evaporation portion arranged lower than the first condenser portion. Here, since the first flow path has hydrophobicity on the surface, a flow path resistance can be kept lower. In addition, since the first flow path is made of the nanomaterial enabling a higher hydrophobicity, the flow path resistance can be kept further lower. Accordingly, flow efficiency of the working fluid from the first condenser portion to the evaporation portion can be improved.

According to an embodiment, since the heat source is thermally connected to the heat spreader, the heat spreader can diffuse the heat of the heat source efficiently.

According to an embodiment, there is provided a heat spreader manufacturing method. The heat spreader manufacturing method includes arranging an evaporation zone in a first position and a first condenser zone in a second position, the second position being one of higher than and apart from the first position, and forming a first nanomaterial layer having hydrophobicity on a surface, between the evaporation zone and the first condenser zone.

According to an embodiment, the first nanomaterial layer having hydrophobicity on the surface is formed to form a flow path for the working fluid from the first condenser zone to the evaporation zone, which enables easier manufacture, higher reliability, and lower costs.

The heat spreader manufacturing method according to an embodiment may further include arranging a second condenser zone in a third position, the third position being one of lower than and apart from the first position, and forming a second nanomaterial layer having hydrophilicity on a surface, between the evaporation zone and the second condenser zone.

According to an embodiment, the second nanomaterial layer having hydrophilicity on the surface is formed to form a flow path for the working fluid from the second condenser zone to the evaporation zone, which enables easier manufacture, higher reliability, and lower costs.

In the heat spreader manufacturing method according to an embodiment, the first nanomaterial layer may be formed vertically or inclinatorily.

According to an embodiment, in a case of arranging the first nanomaterial layer vertically, there can be provided a manufacturing method of the heat spreader in which the flow of the working fluid from the first condenser zone to the evaporation zone can be more efficiently performed. In a case of arranging the first nanomaterial layer inclinatorily, it is possible to provide a plurality of first nanomaterial layers and a plurality of first condenser zones corresponding thereto. Thus, there can be provided a manufacturing method of the heat spreader in which the flow efficiency of the working fluid from the first condenser zones to the evaporation zone can be improved.

According to an embodiment, there is provided a heat spreader manufacturing method including forming, on a substrate having an evaporation area, a nanomaterial layer having hydrophobicity on a surface, and forming, on the nanomaterial layer, a hydrophilic area in a direction toward the evaporation area.

According to an embodiment, the hydrophilic area is formed on the nanomaterial layer having hydrophobicity on the surface to form a flow path for the working fluid to the evaporation area, which enables easier manufacture, higher reliability, and lower costs.

In the heat spreader manufacturing method according to an embodiment, the hydrophilic area may be formed by a groove processing or by patterning.

According to an embodiment, the hydrophilic area may be formed by a groove processing or by patterning, which enables a minute structure and higher reliability.

According to the heat spreader of an embodiment, the flow efficiency of the working fluid from the condenser portion to the evaporation portion can be improved.

According to the heat spreader manufacturing method, easier manufacture and higher reliability are enabled.

Additional features and advantages are described herein, and will be apparent from the following Detailed Description and the figures.

DETAILED DESCRIPTION

The present application will be described with reference to the drawings according to an embodiment.

First Embodiment (Structure of Heat Spreader)

Figure 1:
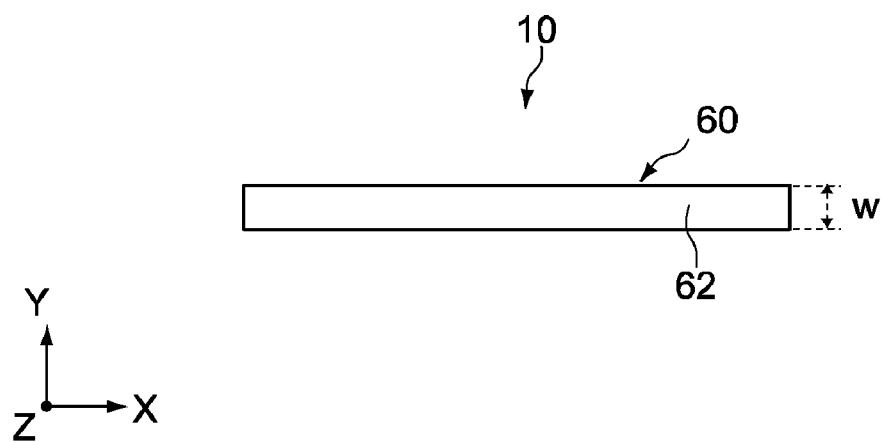
FIG. 1 is a plan view of a heat spreader according to a first embodiment.
Figure 2:
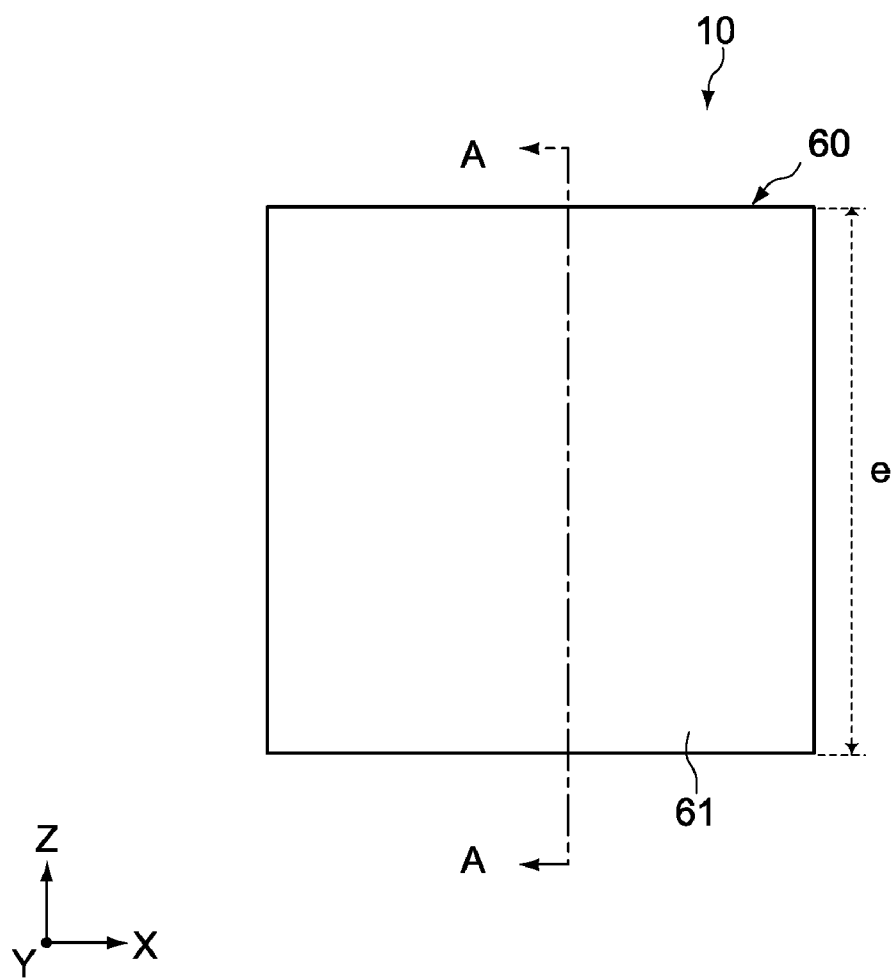
FIG. 2 is a side view of the heat spreader of FIG. 1.
Figure 3:
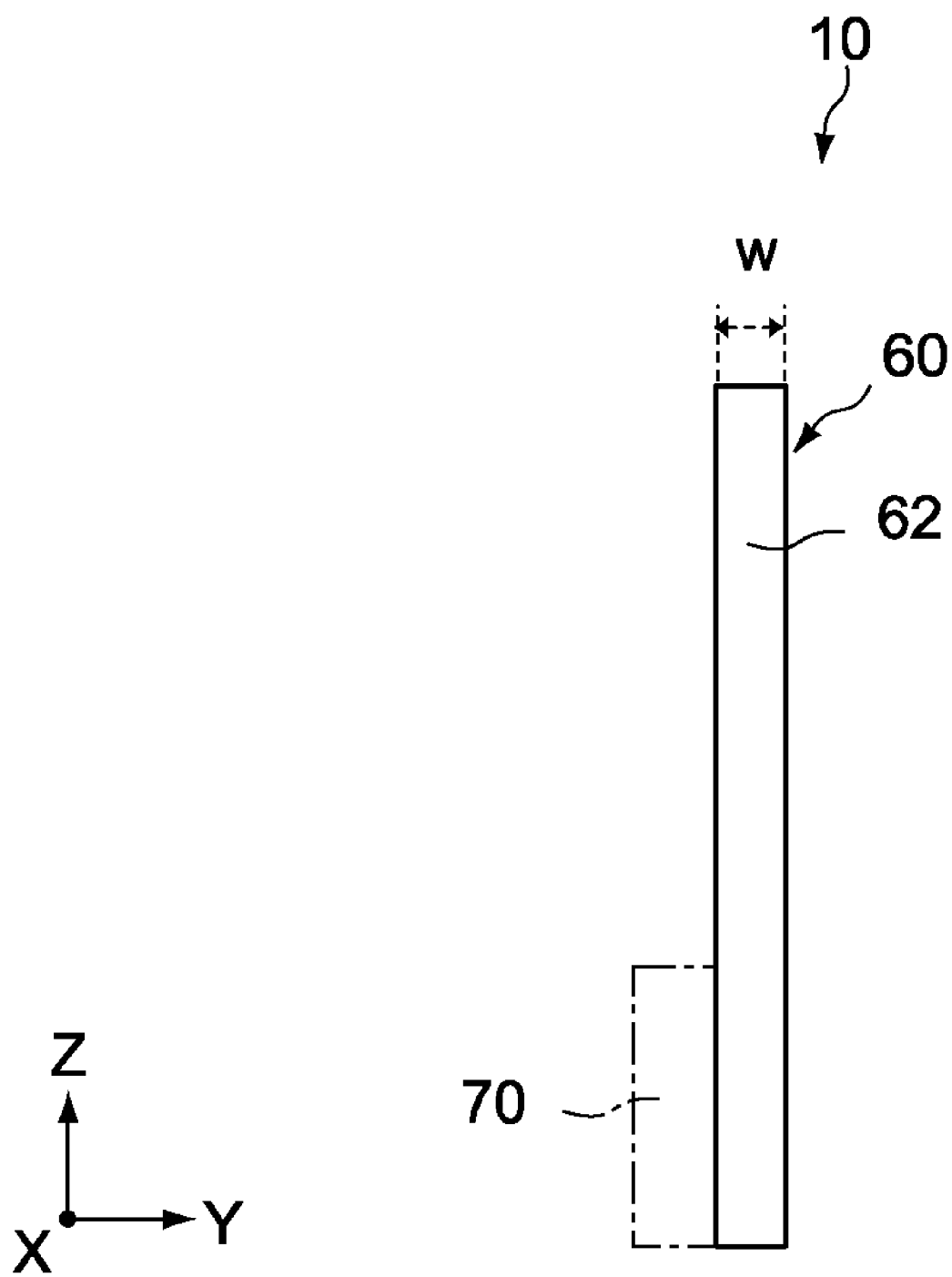
FIG. 3 is a front view of the heat spreader of FIG. 1.
Figure 4:
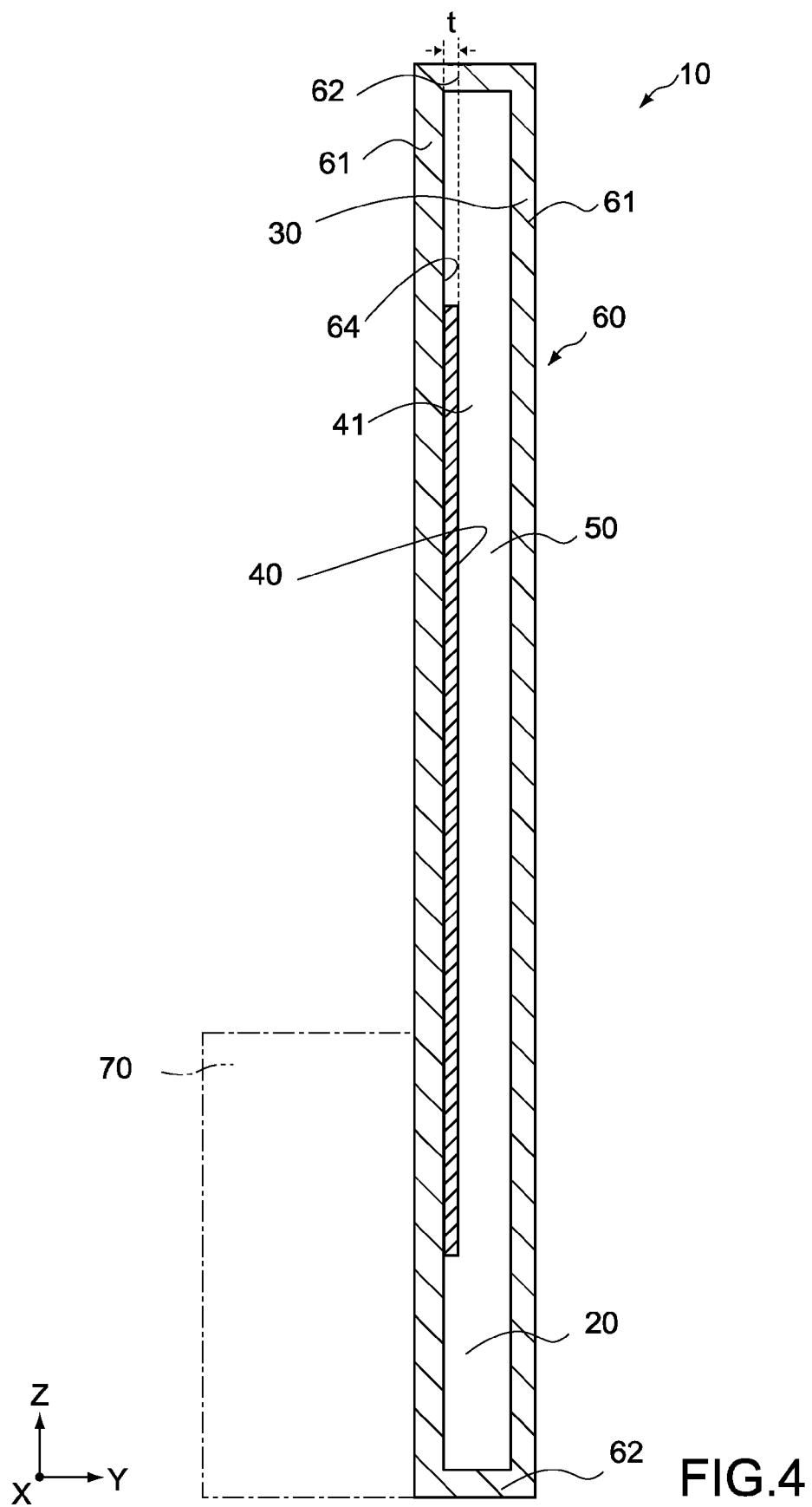
FIG. 4 is a longitudinal sectional view of the heat spreader, seen from the A-A line of FIG. 2.

FIG. 1 is a plan view of a heat spreader according to a first embodiment. FIG. 2 is a side view of the heat spreader of FIG. 1. FIG. 3 is a front view of the heat spreader of FIG. 1. FIG. 4 is a longitudinal sectional view of the heat spreader, seen from the A-A line of FIG. 2.

As shown in FIGS. 1-4, a heat spreader 10 includes a thin rectangular case 60. The case 60 includes therein an evaporation portion 20, a liquid flow path 40 (first flow path), a gas flow path 50, and a condenser portion 30 (first condenser portion). The case 60 further includes a refrigerant (not shown) (working fluid), sealed therein.

The liquid flow path 40 and the gas flow path 50 are provided between the condenser portion 30 and the evaporation portion 20. The liquid flow path 40 and the gas flow path 50 are flow paths for the refrigerant between the condenser portion 30 and the evaporation portion 20.

The condenser portion 30 is arranged at a position higher than the evaporation portion 20. Specifically, the condenser portion 30 is arranged above the evaporation portion 20 in the vertical direction, with the liquid flow path 40 and the gas flow path 50 arranged therebetween. In short, from the above, the condenser portion 30, the liquid flow path 40 and the gas flow path 50, and the evaporation portion 20 are arranged vertically in this order.

The case 60 includes rectangular main plate members 61 and side plate members 62.

The liquid flow path 40 is made of a hydrophobic flow path member 41 (first nanomaterial layer). The hydrophobic flow path member 41 is formed at an approximately center portion in the vertical direction of an inner surface 64 of one main plate member 61. The hydrophobic flow path member 41 faces another main plate member 61 via the inner space of the case 60. The surface of the hydrophobic flow path member 41 mainly functions as the liquid flow path 40. Further, the inner space mainly functions as the gas flow path 50. However, the flow paths cannot be divided clearly. Actually, the liquid-phase refrigerant (hereinafter referred to as liquid refrigerant) may flow in the inner space, and the gas-phase refrigerant (hereinafter referred to as gas refrigerant) may flow on the surface of the hydrophobic flow path member 41.

The evaporation portion 20 is thermally connected with a heat source 70 via the main plate member 61. The phrase thermally connected means, in addition to direct connection, connection via a thermal conductor, for example. The heat source 70 is, for example, an electronic component such as a CPU, a resistance, or another device that generates heat.

The heat spreader 10 of this embodiment is 30-50 mm in length (e) on each side and 2-5 mm in width (w), for example. The heat spreader 10 having such a size is for a CPU of a PC as the heat source 70, which is thermally connected to the heat spreader 10. The size of the heat spreader 10 may be defined in accordance with the size of the heat source 70. For example, in a case where the heat source 70 thermally connected to the heat spreader 10 is a heat source of a large-sized display or the like, the length e may be set to about 2600 mm. The size of the heat spreader 10 is defined such that the refrigerant can flow and condense appropriately. In addition, the shape of the heat spreader 10 is not limited to the rectangular shape as shown in this embodiment. The operating temperature range of the heat spreader 10 is for example −40 degrees to +200 degrees, approximately. The endothermic density of the heat spreader 10 is for example 8W/mm2 or lower.

The hydrophobic flow path member 41 is made of a hydrophobic nanomaterial. The hydrophobic nanomaterial is for example, carbon nanotube, but not limited to the above. The hydrophobic flow path member 41 has hydrophobicity at least on the surface. In other words, the entire hydrophobic flow path member 41 may have hydrophobicity or the surface thereof may be subjected to a hydrophobic processing.

The thickness t of the hydrophobic flow path member 41 is for example 100 nm to 100 μm. In a case where carbon nanotube is used as the nanomaterial, the length of the carbon nanotube is set to 100 nm to 100 μm. In FIG. 4, in order for easily understanding, the scale ratio of the hydrophobic flow path member 41 with respect to the case 60 is made larger than the actual configuration.

In addition to the hydrophobic flow path member 41, the evaporation portion 20 may be formed of a nanomaterial. The nanomaterial has a nanostructure on the surface, so, compared to a case where the evaporation portion 20 is formed of a metal material or the like, the surface area thereof increases and thus the evaporation efficiency improves. The carbon nanotube has approximately 10 times higher thermal conductance than copper, a typical metal material of a metal heat spreader, for example. Accordingly, in a case where the evaporation portion 20 is made of carbon nanotube, an extremely improved evaporation efficiency is obtained compared to an evaporation portion made of a metal material such as copper. Thus, the evaporation portion 20 can be made smaller. The condenser portion 30 may also be made of a nanomaterial.

The case 60 is made of a metal material. The metal material is for example, copper, stainless steel, or aluminum, but not limited to the above. Other than the metal, a material having a high thermal conductance such as carbon may be employed. All of the main plate members 61 and the side plate members 62 may be formed of different materials respectively, some of them may be formed of the same material, or all of them may be made of the same material. The main plate members 61 and the side plate members 62 may be bonded by brazing, that is, welded, or may be bonded with an adhesive material depending on the materials.

As the refrigerant, pure water, alcohol such as ethanol, methanol, or isopropyl alcohol, chlorofluorocarbon, hydrochlorofluorocarbon, fluorine, ammonia, acetone, or the like may be used, but not limited to the above. Meanwhile, in view of latent heat or preservation of the global environment, pure water is preferable.

(Operation of Heat Spreader)

Figure 5:
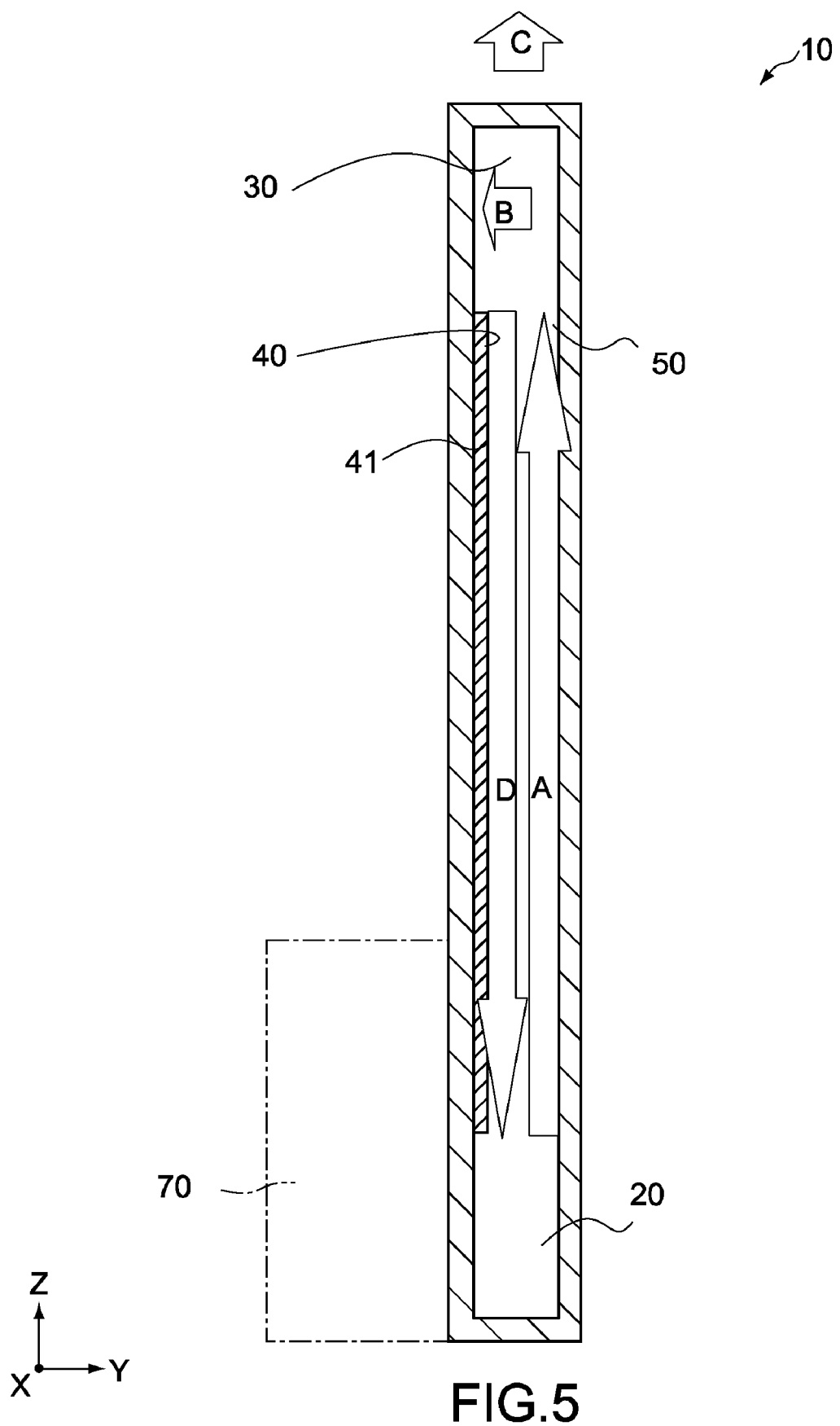
FIG. 5 is a schematic diagram showing an operation of the heat spreader of FIG. 1.

The operation of the heat spreader 10 as structured above will be described. FIG. 5 is a schematic diagram showing the operation. The heat spreader 10 is assumed to be arranged such that the main plate members 61 are arranged, for example, vertically.

When the heat source 70 generates heat, the heat is transferred to the evaporation portion 20 via the main plate member 61 of the case 60. Then, the liquid refrigerant in the evaporation portion 20 evaporates to become the gas refrigerant. The gas refrigerant flows in the gas flow path 50 toward the condenser portion 30 (arrow A). As the gas refrigerant flows in the gas flow path 50, the heat diffuses, and the gas refrigerant condenses in the condenser portion 30 to be the liquid phase (arrow B). Thus the heat spreader 10 radiates the heat (arrow C). The liquid refrigerant flows in the liquid flow path 40 to return to the evaporation portion 20 (arrow D).

By repeating the above operation, the heat of the heat source 70 is diffused by the heat spreader 10.

By controlling the refrigerant flow paths such that the liquid refrigerant flows in the liquid flow path 40 (arrow D) and that the gas refrigerant flows in the gas flow path 50 (arrow A) as described above, it is possible to decrease the amount of mixture of the liquid refrigerant and the gas refrigerant.

The operational zones as shown by the arrows A to D in FIG. 5 are merely rough guide or rough standard, and not clearly defined since respective operational zones may be shifted according to the amount of heat generated by the heat source 70 or the like.

The flow of the liquid refrigerant in the liquid flow path 40 as shown by the arrow D will be described.

The liquid refrigerant flows in the liquid flow path 40 from the condenser portion 30 arranged at a higher position to the evaporation portion 20 arranged at a lower position by gravity. Since the liquid flow path 40 is arranged vertically, the liquid refrigerant can flow in the liquid flow path 40 efficiently.

The main part of the liquid flow path 40 is the surface of the hydrophobic flow path member 41 having hydrophobicity. Because of the hydrophobicity, when the liquid refrigerant flows in the liquid flow path 40, it is possible to keep the contact angle with respect to the hydrophobic flow path member 41 larger. As a result, the flow efficiency in the direction of gravity can further be increased. In the case where the hydrophobic flow path member 41 is made of carbon nanotube, since the carbon nanotube has a large hydrophobicity on the surface, the liquid refrigerant can flow in the liquid flow path 40 from the condenser portion 30 to the evaporation portion 20 with higher efficiency.

As a result, compared to a case of causing the liquid refrigerant to flow with a capillary force, the biased distribution of the liquid refrigerant can be made smaller and the flow path resistance can be smaller. Accordingly, a possibility of a decrease of the supply amount of the liquid refrigerant to the evaporation portion 20 is decreased, so, the circulation of the refrigerant is not adversely affected and the operation stability can be realized.

It should be noted that, to the surface of the main plate member 61 of the heat spreader 10, a not-shown heat radiation member such as a heat sink may be thermally connected. In this case, the heat diffused by the heat spreader 10 is transferred to the heat sink, and radiated from the heat sink.

(Heat Spreader Manufacturing Method)

Figure 6:
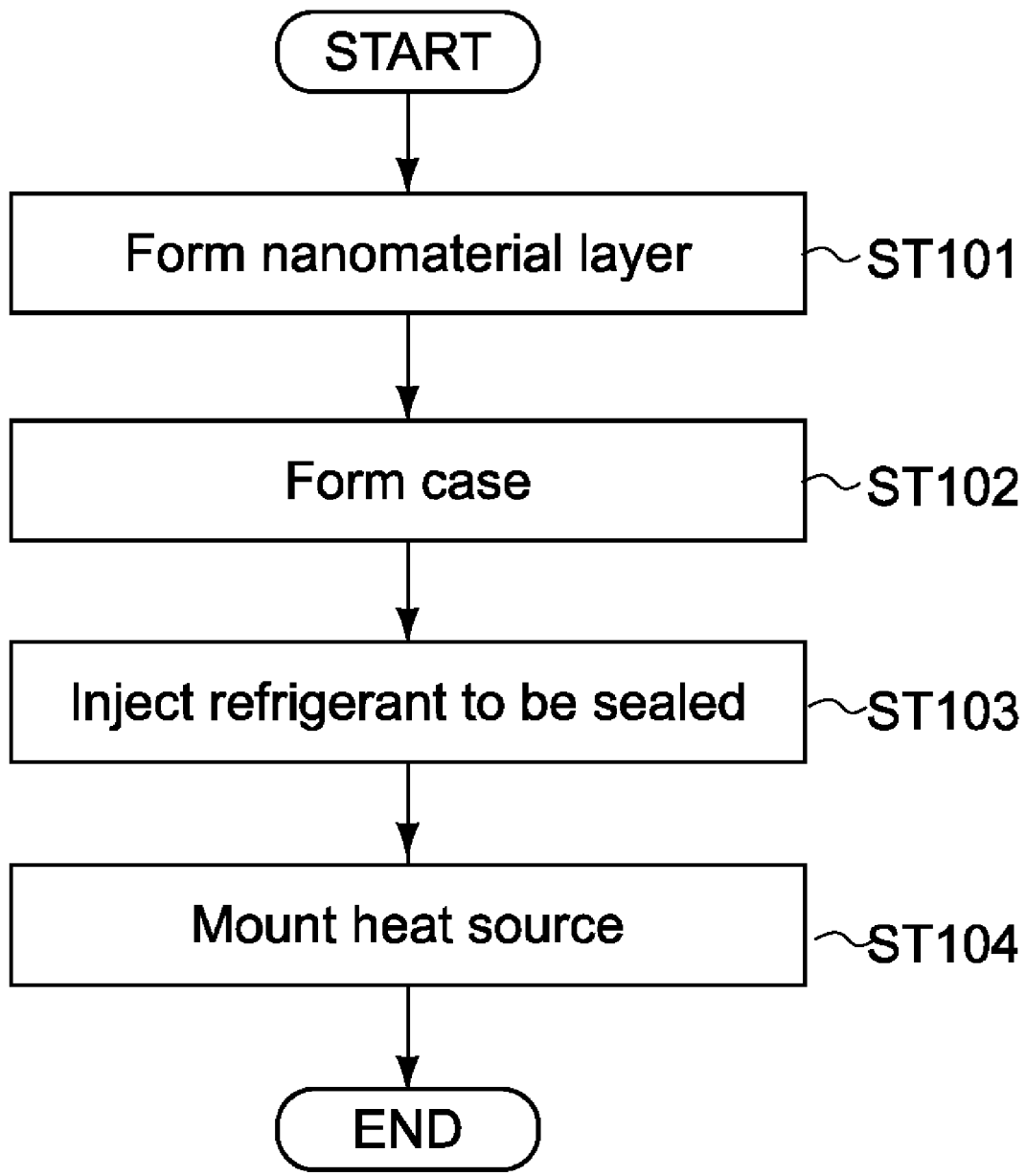
FIG. 6 is a flowchart showing a manufacturing method of the heat spreader of FIG. 1.

Next, an embodiment of the manufacturing method of the heat spreader 10 will be described. FIG. 6 is a flowchart showing the manufacturing method.

The hydrophobic flow path member 41 is formed on the inner surface 64 of the main plate member 61 (Step 101). Specifically, for example, a not-shown catalyst layer is formed on the inner surface 64, and the hydrophobic nanomaterial is densely formed on the catalyst layer. The nanomaterial is formed on the catalyst layer by plasma CVD (Chemical Vapor Deposition) or thermal CVD, but not limited to the above.

Next, the main plate members 61 and the side plate members 62 are bonded liquid-tightly (Step 102) to form the case 60. In the bonding, the respective plate members are precisely aligned. Accordingly, in the inner space of the case 60, the condenser portion 30, the liquid flow path 40 as the surface of the hydrophobic flow path member 41, the gas flow path 50, and the evaporation portion 20 are formed.

Next, the refrigerant is injected into the case 60 to be sealed (Step 103). FIG. 7 are schematic diagrams showing in sequence the injection method of the refrigerant into the case 60. The case 60 includes an injection port 67 and an injection path 65. The injection port 67 and the injection path 65 are provided to one main plate member 61, for example.

Figure 7A:
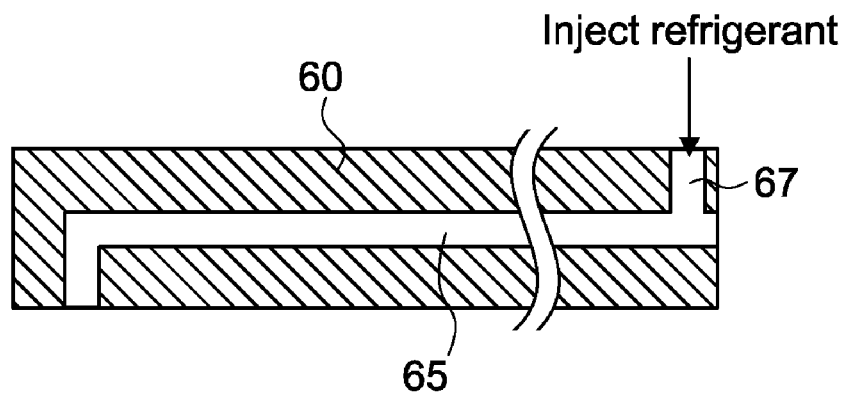
FIG. 7 are schematic diagrams showing in sequence an injection method of a refrigerant into a case.

As shown in FIG. 7A, the pressure of the inner space of the case 60 is decreased via the injection port 67 and the injection path 65, for example, and the refrigerant is infused into the inner space from a not-shown dispenser via the injection port 67 and the injection path 65.

Figure 7B:
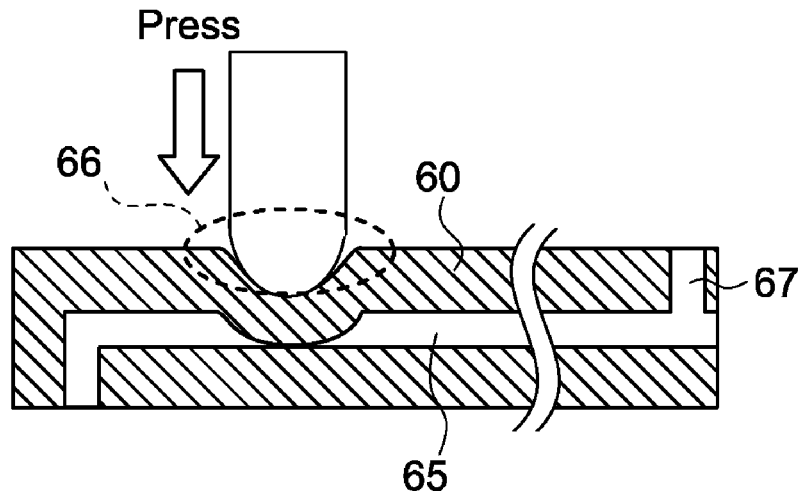

As shown in FIG. 7B, a press area 66 is pressed and the injection path 65 is closed (temporal sealing). The pressure of the inner space of the case 60 is decreased via another injection path 65 and another injection port 67, and when the pressure of the inner space of the case 60 reaches a target pressure, the press area 66 is pressed and the injection path 65 is closed (temporal sealing).

Figure 7C:
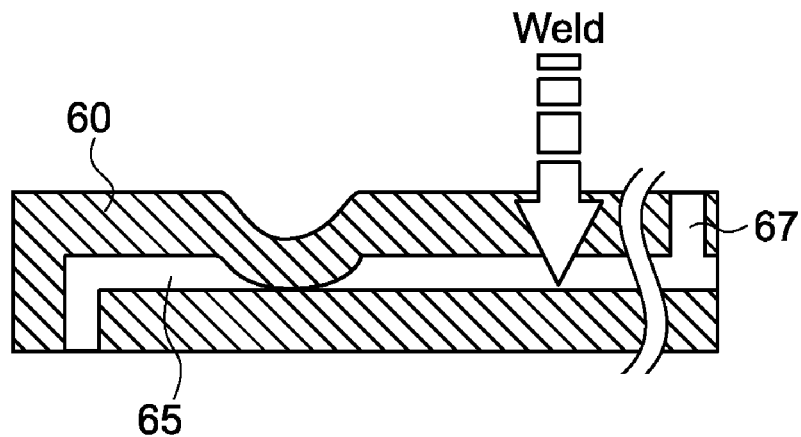

As shown in FIG. 7C, at a side closer to the injection port 67 than the press area 66, the injection path 65 is closed by laser welding for example (final sealing). Accordingly, the inner space of the heat spreader 10 is sealed tightly. By infusing the refrigerant into the inner space of the case 60 to be sealed as described above, the heat spreader 10 is manufactured.

Next, the heat source 70 is mounted to a position of one main plate member 61, corresponding to the evaporation portion 20 (Step 104). In a case where the heat source 70 is a CPU, the process is for example a reflow soldering processing.

The reflow processing and the manufacturing processing of the heat spreader 10 may be executed at different areas (for example different factories). So, in the case of executing the infusion of the refrigerant after the reflow processing, it is necessary to transport the heat spreader 10 to and from the factories, which leads to problems of cost, manpower, time, or generation of particles of the transfer between factories. According to the manufacturing method of FIG. 7, it is possible to execute the reflow processing after the completion of the heat spreader 10, solving the above problem.

According to the manufacturing method of the heat spreader 10 of this embodiment, by forming the nanomaterial having hydrophobicity at a predetermined area before the formation of the case 60 and the injection of the refrigerant, the heat spreader 10 including the condenser portion 30, the liquid flow path 40, the gas flow path 50, and the evaporation portion 20 can be manufactured. Accordingly, the manufacturing method of the heat spreader can be simplified. Further, since it is not necessary to be subjected to a hydrophobic processing or the like, it enables lower costs, easier manufacture, and higher reliability.

Second Embodiment (Structure of Heat Spreader)

A second embodiment will be described. In the following, components, functions, and the like similar to those of the heat spreader 10 of the above embodiment will correspond to similar reference symbols, the description will be simplified or omitted, and different parts will mainly be described.

Figure 8:
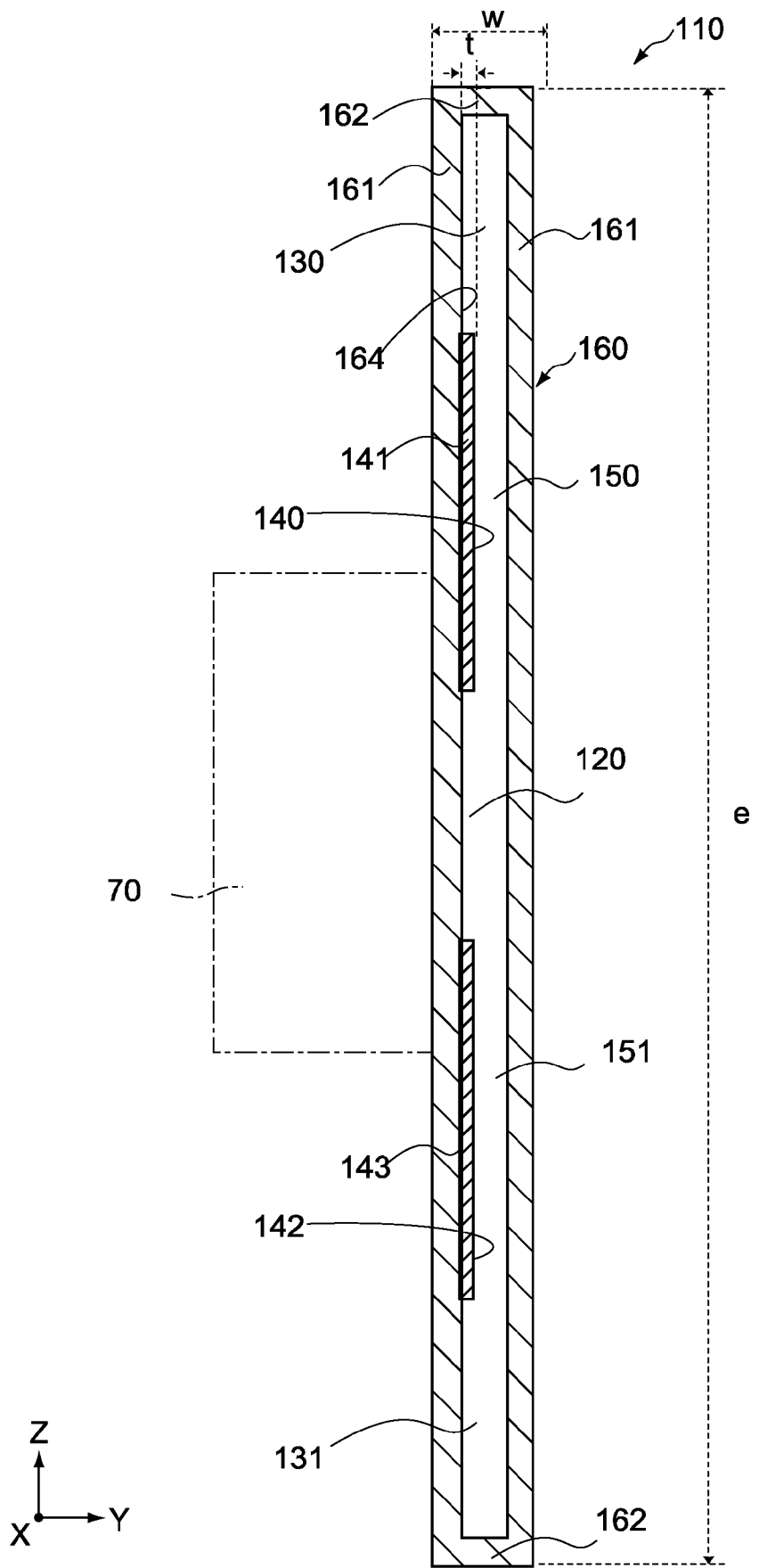
FIG. 8 is a longitudinal sectional view showing a heat spreader according to a second embodiment of the preset application.

FIG. 8 is a longitudinal sectional view showing a heat spreader according to the second embodiment of the preset application.

As shown in FIG. 8, a heat spreader 110 has a thin rectangular case 160 similar to the case 60 of the heat spreader 10 of FIG. 2.

The case 160 includes therein an evaporation portion 120, a first condenser portion 130, a second condenser portion 131, a first liquid flow path 140 (first flow path), a second liquid flow path 142 (second flow path), a first gas flow path 150, and a second gas flow path 151. The case 160 is infused with the not-shown refrigerant.

The first liquid flow path 140 and the first gas flow path 150 are provided between the first condenser portion 130 and the evaporation portion 120. The first liquid flow path 140 and the first gas flow path 150 are flow paths for the refrigerant between the first condenser portion 130 and the evaporation portion 120.

The second liquid flow path 142 and the second gas flow path 151 are provided between the second condenser portion 131 and the evaporation portion 120. The second liquid flow path 142 and the second gas flow path 151 are flow paths for the refrigerant between the second condenser portion 131 and the evaporation portion 120.

The first condenser portion 130 is arranged higher than the evaporation portion 120. Specifically, the first condenser portion 130 is arranged higher in the vertical direction than the evaporation portion 120 with the first liquid flow path 140 and the first gas flow path 150 arranged therebetween.

The second condenser portion 131 is arranged lower than the evaporation portion 120. Specifically, the second condenser portion 131 is arranged lower in the vertical direction than the evaporation portion 120 with the second liquid flow path 142 and the second gas flow path 151 arranged therebetween.

Thus, from the above, the first condenser portion 130, the first liquid flow path 140 and the first gas flow path 150, the evaporation portion 120, the second liquid flow path 142 and the second gas flow path 151, and the second condenser portion 131 are arranged vertically in this order.

The case 160 includes rectangular main plate members 161 and side plate members 162.

The first liquid flow path 140 is made of a hydrophobic flow path member 141 (first nanomaterial layer). The hydrophobic flow path member 141 is formed at an immediately upper portion than the evaporation portion 120 of an inner surface 164 of one main plate member 161. The hydrophobic flow path member 141 faces another main plate member 161 via the inner space of the case 160. The surface of the hydrophobic flow path member 141 mainly functions as the first liquid flow path 140. Further, the inner space mainly functions as the first gas flow path 150. However, the flow paths cannot be divided clearly. Actually, the liquid refrigerant may flow in the inner space, and the gas refrigerant may flow on the surface of the hydrophobic flow path member 141.

The second liquid flow path 142 is made of a hydrophilic flow path member 143 (second nanomaterial layer). The hydrophilic flow path member 143 is formed at an immediately lower portion than the evaporation portion 120 of the inner surface 164 of the one main plate member 161. The hydrophilic flow path member 143 faces the other main plate member 161 via the inner space of the case 160. The surface of the hydrophilic flow path member 143 mainly functions as the second liquid flow path 142. Further, the inner space mainly functions as the second gas flow path 151. However, the flow paths cannot be divided clearly. Actually, the liquid refrigerant may flow in the inner space, and the gas refrigerant may flow on the surface of the hydrophilic flow path member 143.

The evaporation portion 120 is thermally connected with the heat source 70 via the main plate member 161.

The hydrophobic flow path member 141 and the hydrophilic flow path member 143 are made of nanomaterial. The hydrophobic flow path member 141 has hydrophobicity at least on the surface. In other words, the entire hydrophobic flow path member 141 may have hydrophobicity or the surface thereof may be subjected to a hydrophobic processing. The hydrophilic flow path member 143 has hydrophilicity at least on the surface. In other words, the entire hydrophilic flow path member 143 may have hydrophilicity or the surface thereof may be subjected to a hydrophilic processing.

The hydrophobic flow path member 141 and the hydrophilic flow path member 143 may be made of the same nanomaterial. In this case, after forming the flow path members with the nanomaterial, appropriate hydrophilic processing may be executed. The hydrophilic processing may be for example nitric acid processing or ultraviolet radiation.

In addition to the hydrophobic flow path member 141 and the hydrophilic flow path member 143, the evaporation portion 120, the first condenser portion 130, and the second condenser portion 131 may be formed of nanomaterial.

The thickness t of the hydrophobic flow path member 141 and the hydrophilic flow path member 143 is for example 100 nm to 100 μm. In FIG. 8, in order for easily understanding, the scale ratio of the hydrophobic flow path member 141 and the hydrophilic flow path member 143 with respect to the case 160 is made larger than the actual configuration.

The case 160 may be made of a metal material.

The heat spreader 110 is 30-50 mm in length (e) on each side and 2-5 mm in width (w), for example. The shape of the heat spreader 110 is not limited to the rectangular shape as shown in this embodiment.

(Operation of Heat Spreader)

Figure 9:
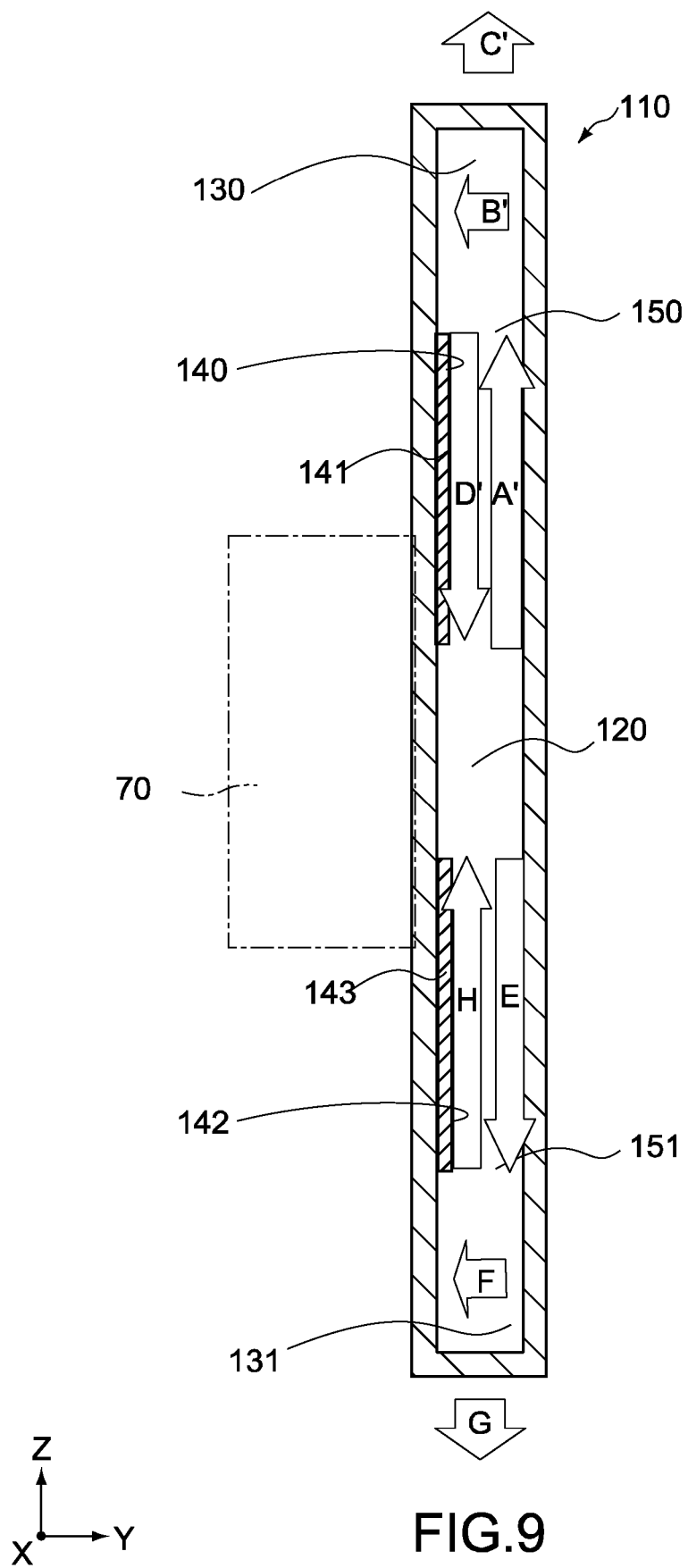
FIG. 9 is a schematic diagram showing an operation of the heat spreader of FIG. 8.

The operation of the heat spreader 110 as structured above will be described. FIG. 9 is a schematic diagram showing the operation. The heat spreader 110 is assumed to be arranged such that the main plate members 161 are arranged, for example, vertically.

When the heat source 70 generates heat, the heat is transferred to the evaporation portion 120 via the main plate member 161 of the case 160. Then, the liquid refrigerant in the evaporation portion 120 evaporates to become the gas refrigerant. Part of the gas refrigerant flows in the first gas flow path 150 toward the first condenser portion 130 (arrow A'). As the gas refrigerant flows in the first gas flow path 150, the heat diffuses, and the gas refrigerant condenses in the first condenser portion 130 to become the liquid phase (arrow B'). Thus the heat spreader 110 radiates the heat (arrow C'). The liquid refrigerant flows in the first liquid flow path 140 to return to the evaporation portion 120 (arrow D'). The operation is similar to the operation of the arrows A-D of FIG. 5.

Meanwhile, other part of the gas refrigerant generated in the evaporation portion 120 flows in the second gas flow path 151 toward the second condenser portion 131 (arrow E). As the gas refrigerant flows in the second gas flow path 151, the heat diffuses, and the gas refrigerant condenses in the second condenser portion 131 to become the liquid phase (arrow F). Thus the heat spreader 110 radiates the heat (arrow G). The liquid refrigerant flows in the second liquid flow path 142 to return to the evaporation portion 120 (arrow H). By repeating the above operation, the heat of the heat source 70 is diffused by the heat spreader 110.

By controlling the refrigerant flow paths such that the liquid refrigerant flows in the first liquid flow path 140 and the second liquid flow path 142 (arrow D', arrow H) and that the gas refrigerant flows in the first gas flow path 150 and the second gas flow path 151 (arrow A', arrow E) as described above, it is possible to decrease the amount of mixture of the liquid refrigerant and the gas refrigerant The operational zones as shown by the arrows A' to D' and the arrows E to H in FIG. 9 are merely rough guide or rough standard, and not clearly defined.

The flow of the liquid refrigerant in the second liquid flow path 142 as shown by the arrow H will be described.

The liquid refrigerant flows in the second liquid flow path 142 as the surface of the hydrophilic flow path member 143 made of nanomaterial from the second condenser portion 131 arranged at a lower position to the evaporation portion 120 arranged at a higher position with a capillary force.

The hydrophilic flow path member 143 has a nanostructure on the surface, that is, an extremely minute structure of 10 nm to 100 µm. For example, when carbon nanotube is employed as the nanomaterial, the diameter of the carbon nanotube is 10 nm to 50 nm, and the length is 100 nm to 100 µm. Accordingly, the liquid refrigerant can flow in the second liquid flow path 142 with a capillary force. Since the hydrophilic flow path member 143 has hydrophilicity on the surface, the liquid refrigerant permeates the surface of the hydrophilic flow path member 143. As a result, the more liquid refrigerant can flow in the second liquid flow path 142 with a capillary force, and the flow efficiency from the second condenser portion 131 to the evaporation portion 120 can be improved.

As described above, according to the heat spreader 110 of this embodiment, both the second liquid flow path 142 causing the liquid refrigerant to flow with a capillary force and the first liquid flow path 140 causing the liquid refrigerant to flow by gravity are employed. Accordingly, the refrigerant is separated to the second liquid flow path 142 side and the first liquid flow path 140 side. Thus, the biased distribution of the liquid refrigerant can be made smaller, and the flow efficiency of the liquid refrigerant from the first condenser portion 130 and the second condenser portion 131 to the evaporation portion 120 can be improved. Accordingly, a possibility of a decrease of the supply amount of the liquid refrigerant to the evaporation portion 120 is decreased, so, the circulation of the refrigerant is not adversely affected and the operation stability can be realized. Further, with respect to one evaporation portion 120, a plurality of flow paths, that is, the first liquid flow path 140 and the second liquid flow path 142, and a plurality of condenser portions corresponding thereto, that is, the first condenser portion 130 and the second condenser portion 131 can be provided, which improves heat diffusion efficiency.

(Heat Spreader Manufacturing Method)

To manufacture the heat spreader 110, a nanomaterial layer is formed to form the hydrophobic flow path member 141 (corresponding to Step 101 of FIG. 6), and another nanomaterial layer is formed and subjected to appropriate hydrophilic processing, to form the hydrophilic flow path member 143. The nanomaterial is for example carbon nanotube, but not limited to the above. The hydrophilic processing may be for example nitric acid processing or ultraviolet radiation.

The evaporation portion 120, the first condenser portion 130, and the second condenser portion 131 may be formed of nanomaterial. The evaporation portion 120, the first condenser portion 130, and the second condenser portion 131 are for example hydrophilic.

After the formation of the hydrophobic flow path member 141 and the hydrophilic flow path member 143, the heat spreader 110 may be manufactured with the manufacturing method of Step 102 to Step 104 of FIG. 6.

According to the heat spreader manufacturing method of this embodiment, it is not necessary to form a wick structure or the like on the surface of the liquid flow path, and it is only necessary to execute the hydrophilic processing to realize a capillary action, which enables easier manufacture, higher reliability, and lower costs.

Third Embodiment

Figure 10:
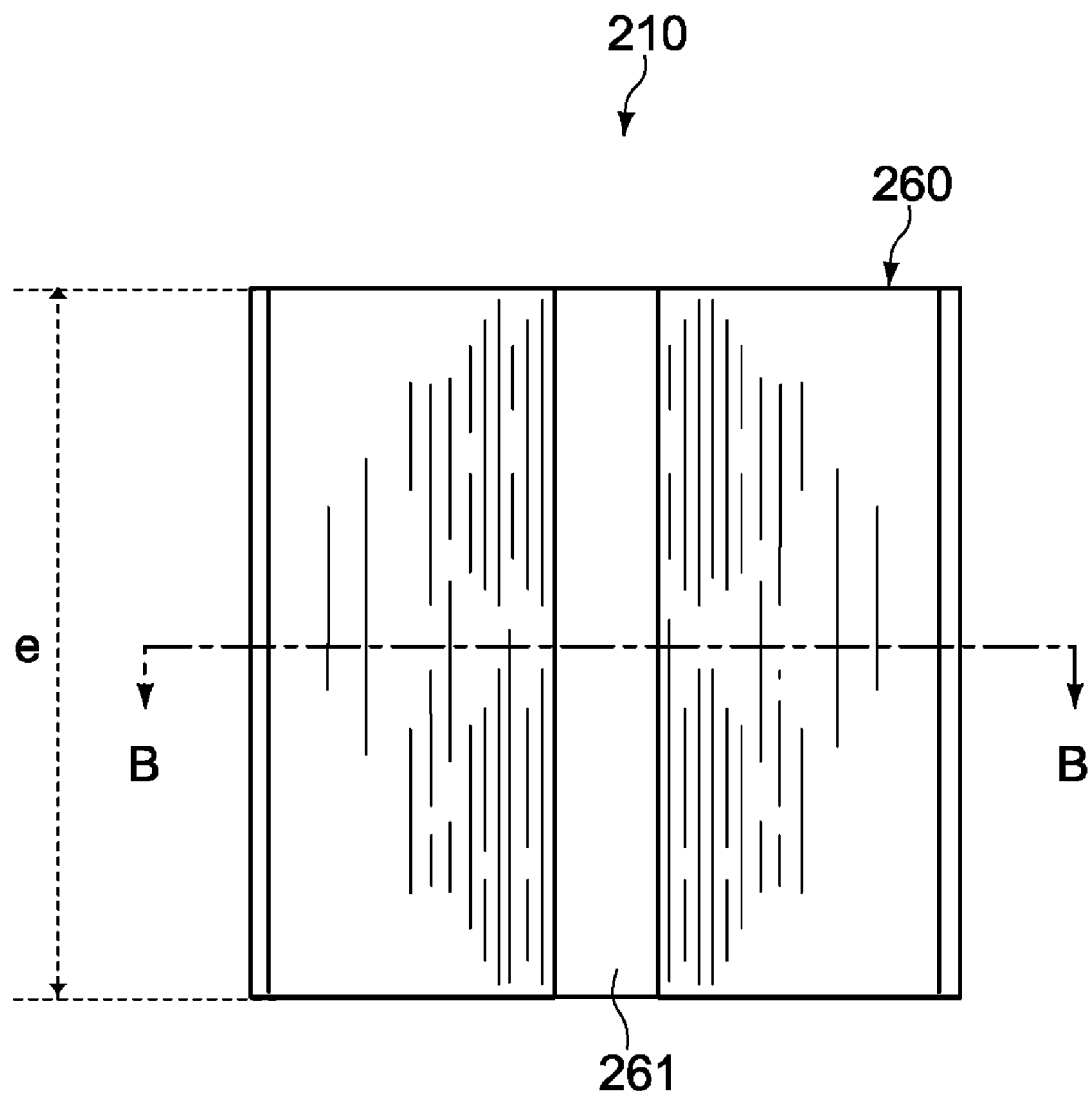
FIG. 10 is a plan view of a heat spreader according to a third embodiment.
Figure 10:
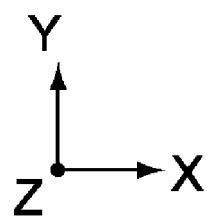
Figure 11:
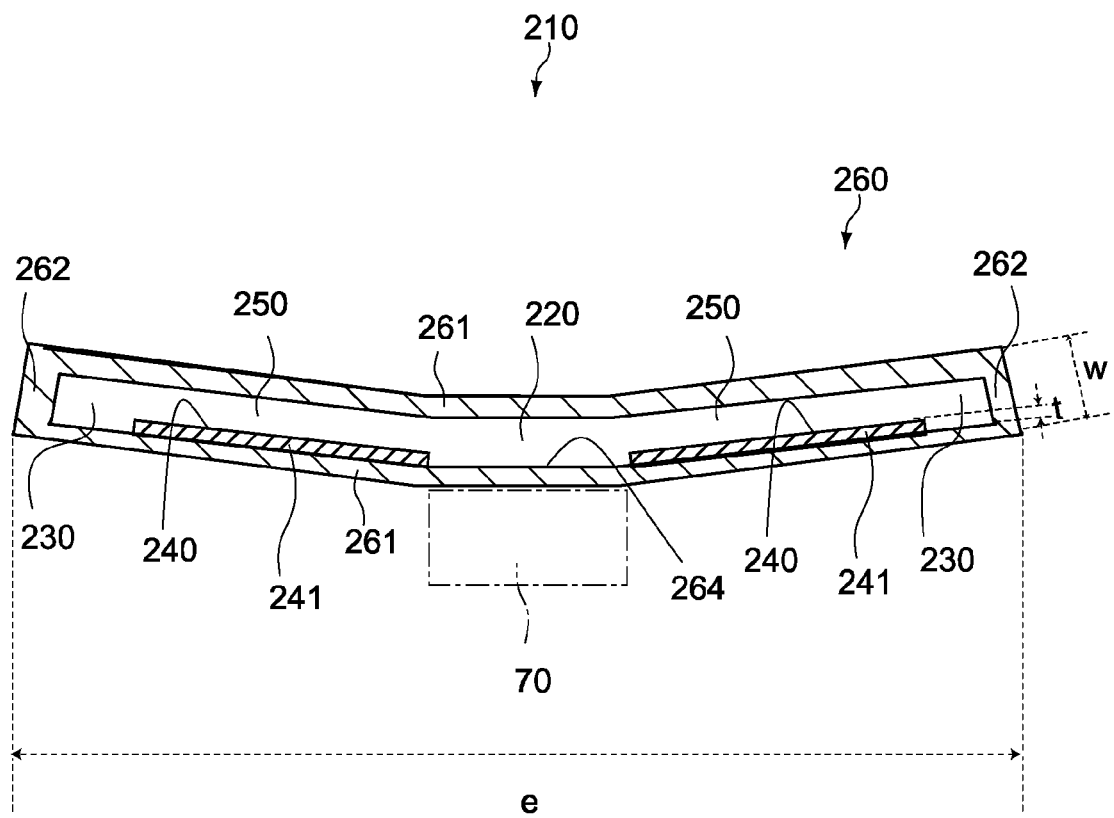
FIG. 11 is a longitudinal sectional view of the heat spreader, seen from the B-B line of FIG. 10.

FIG. 10 is a plan view of a heat spreader according to a third embodiment. FIG. 11 is a longitudinal sectional view of the heat spreader, seen from the B-B line of FIG. 10.

As shown in FIGS. 10 and 11, the heat spreader 210 includes a thin rectangular case 260. The case 260 is rectangular in the plan view. Seen from the lateral direction, the center portion is arranged lower than left and right end portions.

The case 260 includes therein an evaporation portion 220, a plurality of liquid flow paths 240 (first flow path), a plurality of gas flow paths 250, and a plurality of condenser portions 230 (first condenser portion). The case 260 further includes the refrigerant (not shown), sealed therein.

The liquid flow paths 240 and the gas flow paths 250 are respectively provided between the condenser portions 230 and the evaporation portion 220. The liquid flow paths 240 and the gas flow paths 250 are flow paths for the refrigerant between the condenser portions 230 and the evaporation portion 220.

The evaporation portion 220 is formed at the lowest position in the case 260.

The condenser portions 230 are arranged higher than the evaporation portion 220. Specifically, the condenser portions 230 are arranged higher than the evaporation portion 220 with the liquid flow paths 240 and the gas flow paths 250 arranged therebetween. In FIG. 11, the plurality of condenser portions 230 are arranged at substantially the same height, but not limited to the above. The liquid flow paths 240 and the gas flow paths 250 are arranged so as to be inclined. Thus, from the above, the condenser portions 230, the liquid flow paths 240 and the gas flow paths 250, and the evaporation portion 220 are arranged in this order.

The case 260 includes main plate members 261 as an upper surface and a bottom surface, and side plate members 262 as wall surfaces.

The liquid flow paths 240 are made of hydrophobic flow path members 241 (first nanomaterial layer). The hydrophobic flow path members 241 are formed at a portion higher than the evaporation portion 220 and lower than the condenser portions 230 of an inner surface 264 of one main plate member 261 as the bottom surface so as to be inclined. The hydrophobic flow path members 241 face another main plate member 261 via the inner space of the case 260. The surfaces of the hydrophobic flow path members 241 mainly function as the liquid flow paths 240 in the inner space. Further, the inner space mainly functions as the gas flow paths 250. However, the flow paths cannot be divided clearly. Actually, the liquid refrigerant may flow in the inner space, and the gas refrigerant may flow on the surfaces of the hydrophobic flow path members 241.

The heat spreader 210 of this embodiment is, for example, 30-50 mm in length (e) on each side (length of the elongated direction of the side plate member 262) and 2-5 mm in width (w) (length of the side orthogonal to the elongated direction of the side plate member 262) in the plan view. The shape of the heat spreader 210 is not limited to the shape as shown in this embodiment.

The evaporation portion 220 is thermally connected with the heat source 70 via the main plate member 261.

The hydrophobic flow path members 241 are made of a hydrophobic nanomaterial. The hydrophobic nanomaterial is for example, carbon nanotube, but not limited to the above. The hydrophobic flow path members 241 have hydrophobicity at least on the surfaces. In other words, the entire hydrophobic flow path members 241 may have hydrophobicity or the surfaces thereof may be subjected to a hydrophobic processing. The thickness t of the hydrophobic flow path members 241 is for example 100 nm to 100 μm. In a case where carbon nanotube is used as the nanomaterial, the length of the carbon nanotube is set to 100 nm to 100 μm.

In addition to the hydrophobic flow path members 241, the evaporation portion 220 and the condenser portions 230 may be formed of a nanomaterial.

The case 260 is made of a metal material, for example.

The heat spreader 210 is different from the heat spreader 10 of the first embodiment in that the hydrophobic flow path members 241, the liquid flow paths 240, and the gas flow paths 250 are inclined, and the plurality of condenser portions 230, hydrophobic flow path members 241, liquid flow paths 240, and gas flow paths 250 are provided. By forming the hydrophobic flow path members 241, the liquid flow paths 240, and the gas flow paths 250 to be inclined, it is possible to form the plurality of condenser portions 230, hydrophobic flow path members 241, liquid flow paths 240, and gas flow paths 250. Accordingly, the refrigerant is separated in a plurality of directions. Thus, the biased distribution of the liquid refrigerant can be made smaller. Accordingly, the flow efficiency of the liquid refrigerant from the condenser portions 230 to the evaporation portion 220 can be improved.

Since the liquid flow paths 240 have hydrophobicity on the surfaces, the liquid refrigerant can flow to the evaporation portion 220 by gravity even without arranging the liquid flow paths 240 vertically. In the case where the inclination angle of the liquid flow paths 240 is further smaller, the hydrophobicity enhances the flow by gravity. Thus, the heat spreader can be provided not vertically but substantially horizontally, and can be provided depending on various provision conditions.

Here, an example where two condenser portions 230, two hydrophobic flow path members 241, two liquid flow paths 240, and two gas flow paths 250 are provided is shown, but not limited to the above. For example, three or more condenser portions 230, hydrophobic flow path members 241, liquid flow paths 240, and gas flow paths 250 may be provided.

The operation of the heat spreader 210 is similar to the operation of the heat spreader 10 of the first embodiment (FIG. 5). Here, the flow of the liquid refrigerant in the liquid flow paths 240 (corresponding to arrow D of FIG. 5) will merely be described.

The liquid refrigerant flows in the liquid flow paths 240 from the condenser portions 230 arranged at a higher position to the evaporation portion 220 arranged at a lower position by gravity. Since the liquid flow paths 240 are inclined, the liquid refrigerant can flow in the liquid flow paths 240 by gravity.

The liquid flow paths 240 are the surfaces of the hydrophobic flow path members 241 having hydrophobicity. Because of the hydrophobicity, the liquid refrigerant does not permeate the surfaces of the hydrophobic flow path members 241 when flowing in the liquid flow paths 240, and therefore it is possible to keep the contact angle with respect to the hydrophobic flow path members 241 larger. As a result, the flow efficiency can further be increased. In the case where the hydrophobic flow path members 241 are made of carbon nanotube, since the carbon nanotube has a large hydrophobicity on the surface, the liquid refrigerant can flow in the liquid flow paths 240 from the condenser portions 230 to the evaporation portion 220 with higher efficiency.

As a result, compared to a case of causing the liquid refrigerant to flow with a capillary force, the biased distribution of the liquid refrigerant can be made lesser and the flow path resistance can be smaller.

In addition, since the plurality of condenser portions 230 and the liquid flow paths 240 are formed, the circulation efficiency of the liquid refrigerant to the evaporation portion 220 is farther improved. As a result, a fear of decrease of the supply amount of the liquid refrigerant to the evaporation portion 220 is decreased.

The manufacturing method of the heat spreader 210 is similar to the manufacturing method of the heat spreader 10 of the first embodiment (FIG. 6), so the description thereof will be omitted.

Fourth Embodiment (Structure of Heat Spreader)

Figure 12:
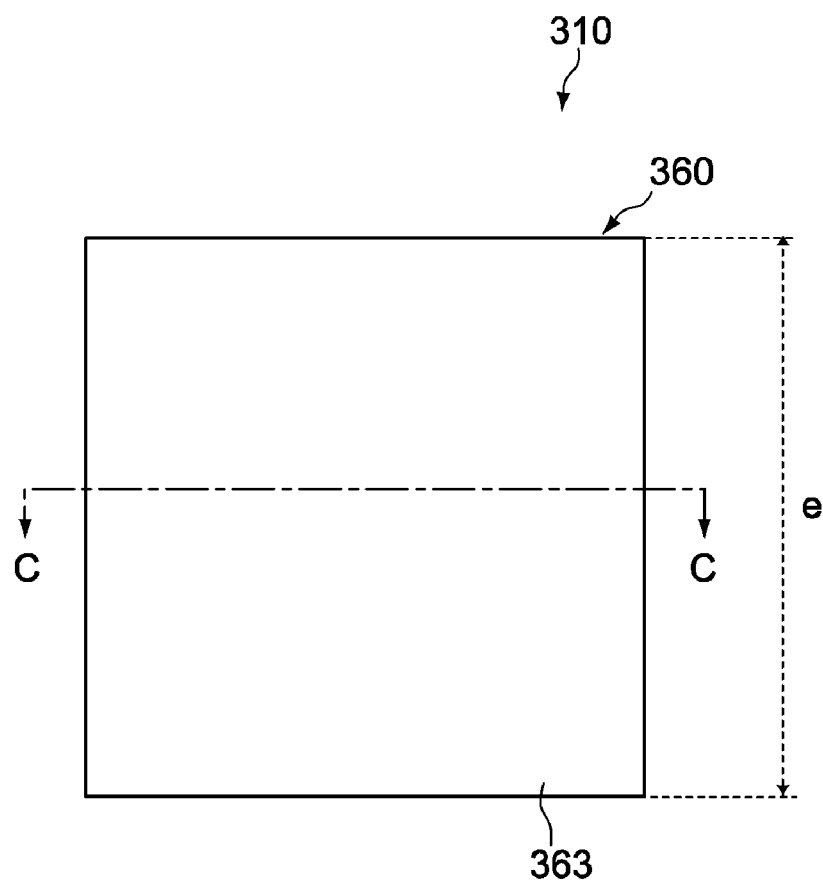
FIG. 12 is a plan view of a heat spreader according to a fourth embodiment
Figure 12:
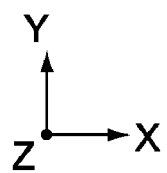
Figure 13:
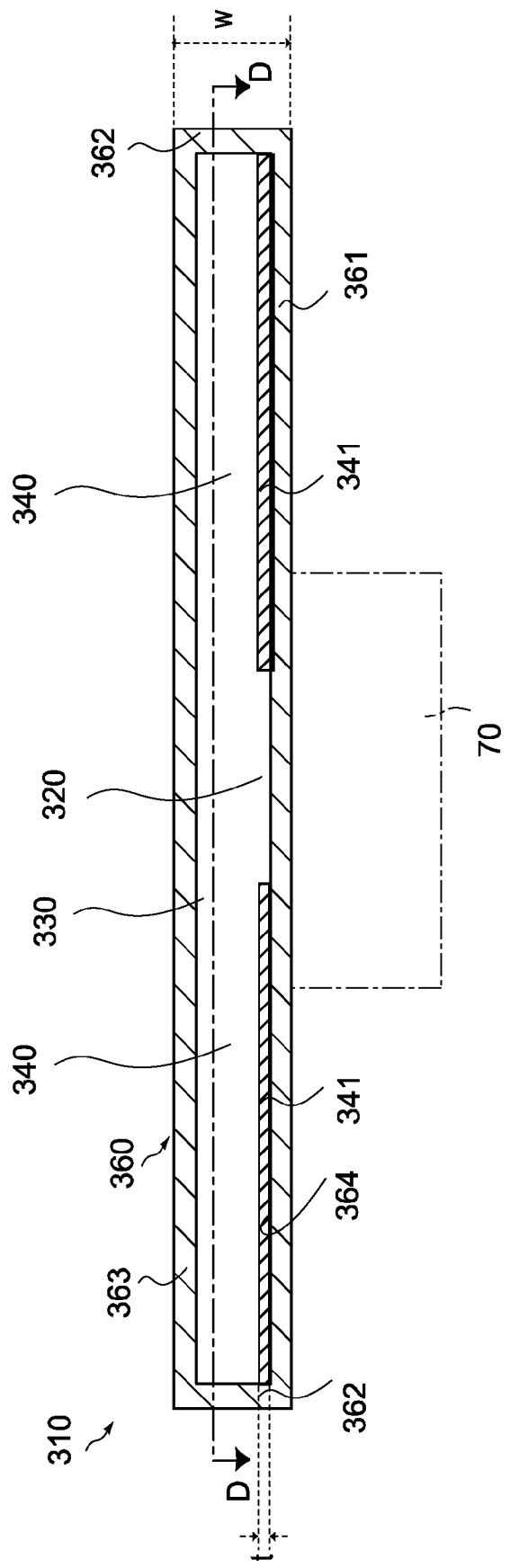
FIG. 13 is a longitudinal sectional view of the heat spreader, seen from the C-C line of FIG. 12.
Figure 14:
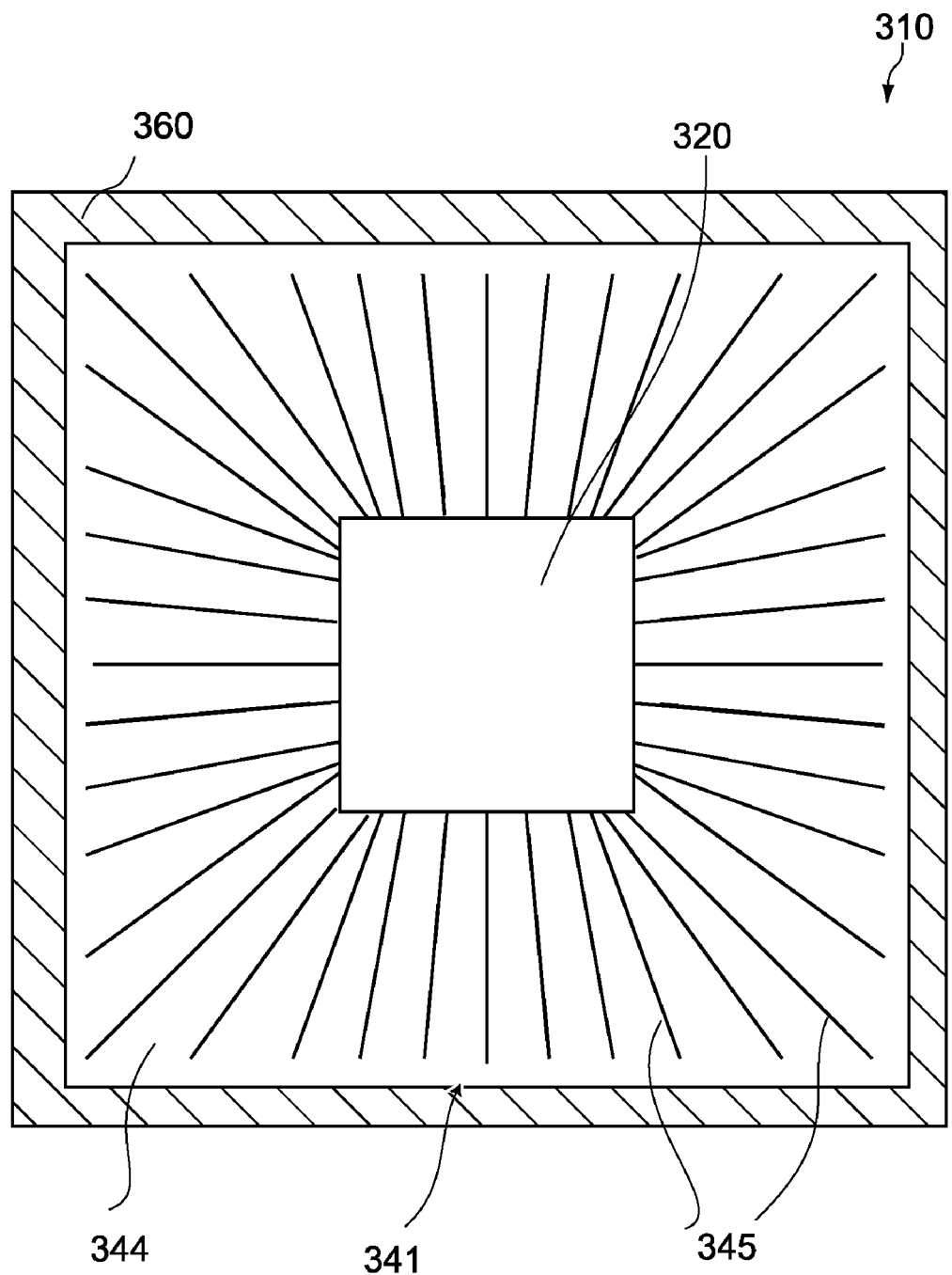
FIG. 14 is a sectional view of the heat spreader, seen from the D-D line of FIG. 13.

FIG. 12 is a plan view of a heat spreader according to a fourth embodiment. FIG. 13 is a longitudinal sectional view of the heat spreader, seen from the C-C line of FIG. 12. FIG. 14 is a sectional view of the heat spreader, seen from the D-D line of FIG. 13.

As shown in FIGS. 12-14, the heat spreader 310 includes a thin rectangular case 360.

The case 360 includes therein an evaporation portion 320, a flow path 340 (first flow path), and a condenser portion 330 (first condenser portion). The case 360 further includes the refrigerant (not shown), sealed therein.

The flow path 340 is provided between the condenser portion 330 and the evaporation portion 320. The flow path 340 is a flow path for the refrigerant between the condenser portion 330 and the evaporation portion 320.

The case 360 includes a rectangular bottom plate member 361, a rectangular top plate member 363, and side plate members 362.

The condenser portion 330 is arranged higher than the evaporation portion 320. Specifically, the condenser portion 330 is arranged above the evaporation portion 320 in the vertical direction, with the flow path 340 arranged therebetween. In short, from the above to the below, the condenser portion 330, the flow path 340, and the evaporation portion 320 are arranged vertically.

The flow path 340 includes a hydrophobic flow path member 341 (nanomaterial layer). The hydrophobic flow path member 341 is formed at an inner surface 364 of the bottom plate member 361 so as to surround the evaporation portion 320. That is, the hydrophobic flow path member 341 is arranged at substantially the same height as the evaporation portion 320.

The hydrophobic flow path member 341 includes a plurality of hydrophilic portions 345 and a hydrophobic portion 344. The hydrophilic portions 345 are formed substantially linearly in the direction toward the evaporation portion 320. Specifically, the hydrophilic portions 345 are formed radially with the evaporation portion 320 being the center, but not limited to the above. In addition, without providing the plurality of hydrophilic portions 345, one continuous hydrophilic portion 345 may be provided.

Each of the hydrophilic portions 345 has a width realizing a capillary force. The hydrophilic portions 345 have hydrophilicity on the surface. The hydrophilic portions 345 may be plane formed by patterning, or may be groove-like. In the case where the hydrophilic portions 345 are groove-like, the size of the groove has a size realizing a capillary force. The hydrophobic portion 344 is an area free from the hydrophilic portions 345. In order for easily understanding, the number of the hydrophilic portions 345 is decreased in the figure.

The evaporation portion 320 is rectangular in the plan view, for example, but not limited to the above. The evaporation portion 320 is thermally connected with the heat source 70 via the bottom plate member 361.

The heat spreader 310 is, for example, 30-50 mm in length (e) on each side and 2-5 mm in width (w). The shape of the heat spreader 310 is not limited to the rectangular shape as shown in this embodiment.

The hydrophobic flow path member 341 is made of a hydrophobic nanomaterial. The hydrophobic nanomaterial is for example, carbon nanotube, but not limited to the above. The hydrophobic flow path member 341 has hydrophobicity at least on the surface. In other words, the entire hydrophobic flow path member 341 may have hydrophobicity or the surface thereof may be subjected to a hydrophobic processing. The thickness t of the hydrophobic flow path member 341 is for example 100 nm to 100 μm. In addition to the hydrophobic flow path member 341, the evaporation portion 320 may be formed of nanomaterial. In a case where carbon nanotube is used as the nanomaterial, the length of the carbon nanotube is set to 100 nm to 100 μm.

The case 360 is made of for example a metal material.

(Operation of Heat Spreader)

The operation of the heat spreader 310 as structured above will be described. The heat spreader 310 is assumed to be arranged such that the condenser portion 330, the flow path 340, and the evaporation portion 320 are arranged vertically.

When the heat source 70 generates heat, the heat is transferred to the evaporation portion 320 via the bottom plate member 361 of the case 360. Then, the liquid refrigerant in the evaporation portion 320 evaporates to become the gas refrigerant. The gas refrigerant flows in the flow path 340 toward the condenser portion 330. As the gas refrigerant flows in the flow path 340, the heat diffuses, and the gas refrigerant condenses in the condenser portion 330 to become the liquid phase. Thus the heat spreader 310 radiates the heat. The liquid refrigerant flows in the flow path 340 toward the hydrophobic flow path member 341. The liquid refrigerant flows in the hydrophobic flow path member 341 to return to the evaporation portion 320. By repeating the above operation, the heat of the heat source 70 is diffused by the heat spreader 310.

The flow of the liquid refrigerant on the hydrophobic flow path member 341 will be described. The liquid refrigerant on the hydrophobic flow path member 341 is repelled at the hydrophobic portion 344. The liquid refrigerant repelled at the hydrophobic portion 344 is aggregated to the hydrophilic portions 345. The liquid refrigerant aggregated to the hydrophilic portions 345 flows in the hydrophilic portions 345 formed linearly as liquid flow paths with a capillary force toward the evaporation portion 320.

With this structure, in not only the case where the flow path 340 is arranged above the evaporation portion 320, but also the case where the flow path 340 is arranged substantially the same height as the evaporation portion 320, the flow efficiency of the liquid refrigerant from the condenser portion 330 to the evaporation portion 320 can be improved. Accordingly, the higher flow efficiency is maintained.

Since the liquid refrigerant flows to the evaporation portion 320 mainly by a capillary force, the heat spreader 310 can be used in not only the case where the condenser portion 330, the flow path 340, and the evaporation portion 320 are arranged vertically, but may also the case where they are arranged horizontally.

(Heat Spreader Manufacturing Method)

Next, an embodiment of the manufacturing method of the heat spreader 310 will be described.

The hydrophobic flow path member 341 is formed on an area except the evaporation portion 320 of the inner surface 364 of the bottom plate member 361. Specifically, a not-shown catalyst layer is formed on the inner surface 364, and the hydrophobic nanomaterial is densely formed on the catalyst layer. The nanomaterial can be formed on the catalyst layer by plasma CVD or thermal CVD, but not limited to the above.

Alternatively, a nanomaterial layer may be formed on the entire area of the inner surface 364, the evaporation portion 320 may be formed on a predetermined area, and another area may be formed as the hydrophobic flow path member 341.

Next, predetermined areas of the hydrophobic flow path member 341 are subjected to a hydrophilic processing to form the hydrophilic portions 345. The hydrophilic processing may be for example nitric acid processing for generating a carboxyl group or ultraviolet radiation, performed on the nanomaterial layer. The hydrophilic portions 345 are linearly formed. The hydrophilic portions 345 may be plane formed by patterning or by a groove processing.

After the formation of the hydrophobic flow path member 341 on the inner surface 364 of the bottom plate member 361 and the formation of the hydrophilic portions 345 on the hydrophobic flow path member 341, the heat spreader 310 may be manufactured with the manufacturing method of Step 102 to Step 104 of FIG. 6.

According to the heat spreader manufacturing method of this embodiment, the hydrophilic portions 345 are formed by the groove processing or by patterning. Accordingly, the minute structure can be formed and the manufacturing method of a higher reliability is enabled.

As described above, the heat spreaders 10, 110, 210, or 310 are the devices derived based on the fundamental concept of improving the flow efficiency of the liquid refrigerant by gravity by making the liquid flow paths hydrophobic, and improving the flow efficiency of the liquid refrigerant with a capillary force by making the liquid flow paths hydrophilic.

(Example of Electric Apparatus)

Figure 15:
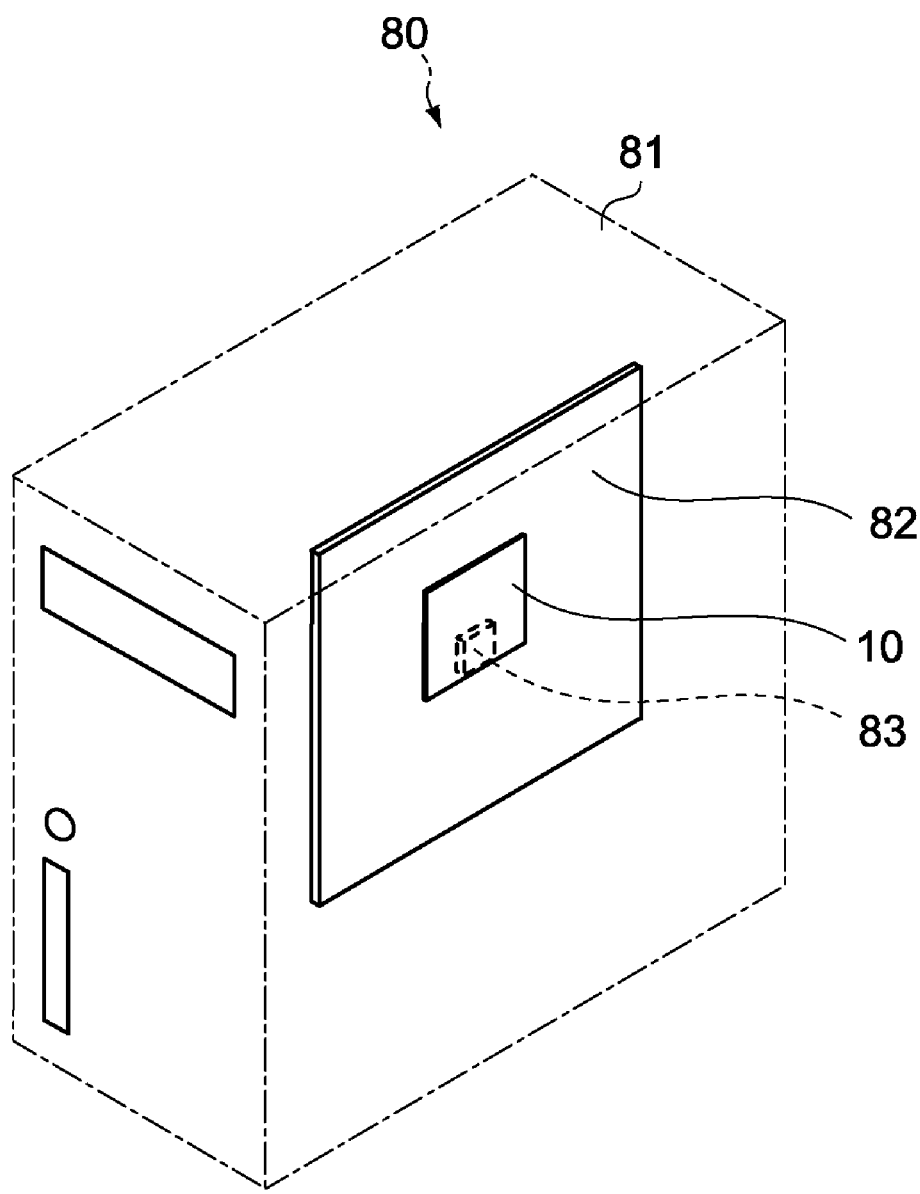
FIG. 15 is a perspective view showing a desktop PC as an electronic apparatus including the heat spreader according to an embodiment.

FIG. 15 is a perspective view showing a desktop PC as an electronic apparatus including the heat spreader 10. In a case 81 of a PC 80, a circuit board 82 is provided, and a CPU 83 for example is mounted on the circuit board 82. The CPU 83 as a heat source is thermally connected with the heat spreader 10, and the heat spreader 10 is thermally connected with a not-shown heat sink.

In the example of the figure, the CPU 83 is connected to a lower portion of the main plate member 61 of the heat spreader 10 in the vertical direction. Although not shown, in the case of using the heat spreader 110, the CPU 83 may be thermally connected substantially at a center portion of the main plate member 161 of the heat spreader 110.

In the example of the figure, the heat spreader 10 is arranged substantially vertically. Although not shown, the heat spreader may be arranged substantially horizontally. In this case, the heat spreader 210, 310 may be used. The heat spreader 210, 310 may be arranged substantially horizontally, and the heat source may be thermally connected approximately at the center portion of the bottom surface of the heat spreader 210, 310.

For example, the heat spreader 10, 110 is arranged vertically, but not limited to the above. The heat spreader 10, 110 may be arranged tilted or substantially horizontally for example, or may include a heat spreader including an evaporation portion and a condenser portion which are apart from each other.

The shape of the heat spreader 10, 110 in the side view and the shape of the heat spreader 210, 310 in the plan view are rectangular. However, the shape in the side view or in the plan view may be circular, ellipsoidal, polygonal, or another arbitrary shape. Alternatively, not limited to the thin rectangular heat spreader, the device may be formed as a heat pipe.

The shape and the like of the hydrophobic flow path member 41, 141, 241, or 341, the hydrophilic flow path member 143, or the hydrophilic portions 345 may be arbitrarily changed.

As an electronic apparatus, a desktop PC of FIG. 15 is exemplarily shown. However, not limited to the above, as an electronic apparatus, a PDA (Personal Digital Assistance), an electronic dictionary, a camera, a display apparatus, an audio/visual apparatus, a projector, a mobile phone, a game apparatus, a car navigation apparatus, a robot apparatus, a laser generation apparatus (e.g., a laser), or another electronic appliance may be employed.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The application is claimed as follows:

1. A heat spreader, comprising:
an evaporation portion arranged in a first position;
a first condenser portion arranged in a second position, the second position being arranged apart from and higher than the first position;
a working fluid evaporating from a liquid phase to a gas phase in the evaporation portion, and condensing from the gas phase to the liquid phase in the first condenser portion; and
a first flow path made of a nanomaterial, having hydrophobicity on an inclinatory surface, and causing the working fluid condensed to the liquid phase in the first condenser portion to flow to the evaporation portion by a gravitational force via the inclinatory surface of the first flow path.

2. The heat spreader according to claim 1, further comprising:
a second condenser portion arranged in a third position, the third position being arranged apart from and lower than the first position, and enabling the working fluid to condense from the gas phase to the liquid phase; and
a second flow path made of a nanomaterial, having hydrophilicity on a surface, and causing the working fluid condensed to the liquid phase in the second condenser portion to flow to the evaporation portion by a capillary force.

3. The heat spreader according to claim 1, wherein the first flow path includes a hydrophilic portion in a direction toward the evaporation portion.

4. An electronic apparatus, comprising:
a heat source; and
a heat spreader, the heat spreader including an evaporation portion arranged in a first position, a first condenser portion arranged in a second position, the second position being arranged apart from and higher than the first position, a working fluid evaporating from a liquid phase to a gas phase in the evaporation portion, and condensing from the gas phase to the liquid phase in the first condenser portion, and a first flow path made of a nanomaterial, having hydrophobicity on an inclinatory surface, and causing the working fluid condensed to the liquid phase in the first condenser portion to flow to the evaporation portion by a gravitational force via the inclinatory surface of the first flow path.

* * * * *